United States Patent
Kratochvil et al.

(10) Patent No.: US 10,364,958 B2
(45) Date of Patent: Jul. 30, 2019

(54) LIGHT SOURCE

(71) Applicant: Varroc Lighting Systems, s.r.o., Senov u Noveho Jicina (CZ)

(72) Inventors: Jan Kratochvil, Horka-Domky (CZ); Stanislav Klimicek, Fulnek (CZ); Vaclav Stihel, Novy Jicin (CZ); Zdenek Mikeska, Borsice u Blatnice (CZ); Milan Kytka, Dolny Kubin (SK)

(73) Assignee: Varroc Lighting Systems, s.r.o., Senov u Noveho Jicina (CZ)

( * ) Notice: Subject to any disclaimer, the term of this patent is extended or adjusted under 35 U.S.C. 154(b) by 0 days.

(21) Appl. No.: 14/934,945

(22) Filed: Nov. 6, 2015

(65) Prior Publication Data
US 2016/0131325 A1 May 12, 2016

(30) Foreign Application Priority Data
Nov. 6, 2014 (CZ) ..................... 2014-761

(51) Int. Cl.
*F21S 45/47* (2018.01)
*H01L 33/64* (2010.01)
(Continued)

(52) U.S. Cl.
CPC ............. *F21S 45/47* (2018.01); *F21S 41/141* (2018.01); *F21V 29/70* (2015.01);
(Continued)

(58) Field of Classification Search
CPC ........ F21S 48/115; F21S 48/328; F21S 45/47; F21S 41/141; H01L 33/642; H01L 33/647;
(Continued)

(56) References Cited

U.S. PATENT DOCUMENTS 9,680,078 B2 * 6/2017 Nakabayashi ........ H01L 33/486
2004/0052077 A1 3/2004 Shih
(Continued)

FOREIGN PATENT DOCUMENTS

CN 201190965 Y * 1/2008
DE 10110835 B4 9/2002
(Continued)

OTHER PUBLICATIONS https://patents.google.com/patent/CN201190965Y/en (Google translation of CN201190965Y).*
(Continued)

*Primary Examiner* — Su C Kim
(74) *Attorney, Agent, or Firm* — Hovey Williams LLP

(57) ABSTRACT

A light source comprises light emitting diodes (LED) (1) with a monocrystal (2), covered by a cap (3) of a transparent material at one side and fitted with an anode contact element (4) to supply and a cathode contact element (5) to lead away direct current at the other side. The LED's arranged in a row are connected with their anode contact elements to one thermally and electrically conductive cooling plate (43, 45) and with their cathode contact elements (5) to another cooling plate (53, 55). These mutually insulated cooling plates are arranged with their lateral sides next to each other and on the surfaces averted from the LED's they are fitted with cooling elements for transfer of heat to cooling media. The cooling elements may comprise sets of cooling fins (44, 54; 46, 56) arranged on the sides of the cooling plates averted from the LED's.

4 Claims, 2 Drawing Sheets

(51) Int. Cl.
*F21S 41/141* (2018.01)
*F21V 29/70* (2015.01)
*F21Y 101/00* (2016.01)

(52) U.S. Cl.
CPC ........... *F21Y 2101/00* (2013.01); *H01L 33/64* (2013.01); *H01L 33/642* (2013.01); *H01L 33/644* (2013.01); *H01L 33/648* (2013.01)

(58) Field of Classification Search
CPC ..... H01L 33/64; H01L 33/644; H01L 33/648; F21V 29/70; F21Y 2101/00
See application file for complete search history.

(56) References Cited

U.S. PATENT DOCUMENTS

| | | | | |
|---|---|---|---|---|
| 2004/0095782 | A1* | 5/2004 | Isoda | F21V 29/70 362/555 |
| 2004/0223327 | A1* | 11/2004 | Kuan | B60Q 1/2607 362/249.01 |
| 2005/0068776 | A1* | 3/2005 | Ge | F21V 3/00 362/296.08 |
| 2006/0186535 | A1* | 8/2006 | Baker | H01L 23/3677 257/720 |
| 2007/0007540 | A1* | 1/2007 | Hashimoto | H01L 33/642 257/94 |
| 2009/0323346 | A1* | 12/2009 | Chang | H01L 33/642 362/294 |
| 2013/0201706 | A1* | 8/2013 | Suzuki | F21S 48/00 362/487 |
| 2014/0049965 | A1* | 2/2014 | Aanegola | H01L 33/44 362/259 |

FOREIGN PATENT DOCUMENTS

| | | | |
|---|---|---|---|
| DE | 102004036931 | A1 | 3/2006 |
| DE | 102004036931 | * | 6/2006 |
| EP | 1139439 | A1 | 4/2001 |

OTHER PUBLICATIONS

First Office Action in Corresponding German Application 10 2015 118 984.4 dated Nov. 2, 2017 (8 pages).

* cited by examiner

LIGHT SOURCE

FIELD OF THE INVENTION

The invention relates to a light source, especially for lamps of motor vehicles consisting of light emitting diodes (LED) with a monocrystal, at one side covered by a cap of a transparent material and at the other side equipped with an anode contact element to supply direct current and a cathode contact element to conduct direct current away.

BACKGROUND INFORMATION

LED light sources are also used in great numbers and in many designs for lamps of motor vehicles. LED's most frequently consist of a monocrystal the anode and cathode leads of which are directed from a printed circuit board that controls the intensity of the supplied electric current to prevent overheating of the LED's and shortening of their service life.

One of the important tasks is to ensure sufficient cooling of LED's. It is a well-known fact that the cathode lead of a LED heats up several times more than the anode lead. Therefore, one of the ways of ensuring sufficient cooling is temperature equalization between the cathode and anode part of the LED. As the temperature equalization body must be electrically insulated from the anode and cathode part of the LED, sharing of heat between the cathode and anode part of the LED and the temperature equalization body is limited.

A major obstacle to sufficient cooling of LED's are the entire boards of conductive printed circuits that prevent direct cooling of LED's. As the lighting output of LED's is increasing, the need to remove great amounts of heat that modern LED's emit is rising accordingly. Therefore, LED's have a limited service life due to insufficient cooling.

Devices, especially lamps of motor vehicles, where LED's are used as the light sources are exposed to high ambient temperature differences during operation. These ambient temperature differences must also be overcome by intensive cooling of the LED's. A number of technical designs of prior art are known that strive to improve cooling of light sources consisting of LED's.

The document DE102004036931 (Daimler AG, DE) shows the headlight of a motor vehicle with a light source that contains LED chips (monocrystals) arranged in a row. The principle of the design in accordance with this document is that the anode contact element and the cathode contact element, which are used to lead current to and from each of the chips (monocrystals), are made up of special cooling bodies in the form of mutually insulated plates that lead current and at the same time remove heat from the chip. The plate cooling bodies for cooling of the LED chips (monocrystals) are arranged in parallel next to each other and are electrically insulated from each other. The LED chips (monocrystals) are arranged along the lateral sides of the plate cooling bodies in such a way that the anode contact element of all the chips of the light source is a plate cooler that all the individual chips are connected to by means of electrically conductive wires, and the cathode contact element of all the chips of the light source is another plate cooler whose lateral side the chips of the light source are directly connected to. The plate cooling elements are used to supply and lead away electricity without an inserted conductive printed circuit board. The electrically insulated plate coolers with their main large surfaces arranged adjacent to each other conveniently transfer heat from the cathode plate cooler, which gets heated more, to the anode plate cooler. However, the sum of heat removed from both the plate coolers is low, which results in overheating of the LED chips and their short service life.

The document US20040052077 (Shih Kelvin, US) presents a light emitting diode (LED) having its anode outlet in the form of an anode web and the cathode outlet in the form of a cathode web. The webs are electrically separated from each other and pass into free arms for heat removal. Each free arm passes through a horizontal printed circuit board to control the LED and at its foot it is connected to the conductive circuits of the horizontal printed circuit board by means of a contact connection. A heat equalizer is applied to the cathode as well as anode board by means of electrically non-conductive adhesive to transfer the surplus heat from the cathode side to the anode side and it also ensures air cooling with its free arms. However, a disadvantage of the LED is its low capability to remove heat from the source as the free arms of the webs are part of the printed circuit board and their size, weight and material selection are limited. Thus, the removal of heat from the LED is insufficient.

The document EP1139439 (Relume Corporation, US) shows a light emitting diode (LED) that is made up of one side of a printed circuit board for controlled supply of electricity to the LED and its removal. The anode outlet of the monocrystal of the LED is connected to the anode contact element of the conductive printed circuit board with an electrically conductive wire. The cathode outlet of the monocrystal of the LED consists of an electrically conductive foot of the LED, connected to the cathode contact element of the conductive printed circuit board. The electrically conductive foot fitted with electrically insulating coating passes through the conductive printed circuit board and reaches into a plate cooling element for equalization and removal of heat from the LED. At the side averted from the printed circuit board the plate cooling element is equipped with cooling fins. Heat is removed insufficiently from the electrically conductive foot of the LED source because between the electrically conductive foot and the plate cooling element there must be an electrically insulating layer. The plate cooling element mainly removes heat from the conductive printed circuit board, and therefore it cannot be used for LED's whose consumption of electricity is not controlled by a printed circuit board.

Common disadvantages of the prior art consist in insufficient removal of heat from LED's and a complex structural arrangement of cooling of LED's, which is negatively manifested in the lighting performance and service life of LED's.

The task of the invention is to provide a simple and versatile cooler of a LED light source that will feature a great ability to remove heat even from a higher number of LED's arranged in groups and that will enable higher lighting outputs and a longer service life of LED's.

OBJECT OF THE INVENTION

The disadvantages of the prior art are substantially eliminated and the goal of the invention is achieved by a light source consisting of light emitting diodes (LED) with a monocrystal, covered by a cap of a transparent material at one side and fitted with an anode contact element to supply and a cathode contact element to lead away direct current at the other side, wherein LED's arranged in a row according to the invention are connected with their anode contact elements to one electrically and thermally conductive plate and with their cathode contact elements to another electrically and thermally conductive plate, wherein the mutually insulated cooling plates are arranged with their lateral sides next to each other and on the surfaces averted from the LED's they are fitted with cooling elements for transfer of heat to cooling media.

The cooling elements may preferably consist of systems of cooling fins arranged on the sides of the cooling plates averted from the LED's. The cooling plates can preferably create a flat formation of a planar, round or broken shape or they may be part of the wall of a cooling channel with an open or closed cross-section.

The cooling plates with cooling fins form two sets of separate pieces that are electrically insulated from each other. The parts of each set are connected with screw joints into a large piece where LED's are subsequently installed in such a way that the cathode contact elements are connected to one set and the anode contact elements are connected to the other set (electrically insulated from the first one). For the attachment, thermally and electrically conductive adhesive is used. As the pads of the LED's directly bear on the cooling plates and there is no PCB dielectric layer between them, a better heat transfer from the LED's directly to the thermally conductive plates and cooling elements is achieved, which leads to a temperature reduction of the chip of the LED.

The cooling plates form a two-part divided cooler with electrically insulated sections. The cooling plates are arranged with their lateral sides adjacent to each other.

The cooling plates may create a flat formation of a planar, round or broken shape consisting of more individual plates that are fitted with LED's on one flat side and on the other averted side they are fitted with cooling fins for transfer of heat into the cooling media, which is preferably streaming air.

The cooling plates can be preferably part of a 3D formation, e.g. the wall of a cooling channel with an open or closed cross-section of a round, e.g. circular, or multiangular, e.g. tri- or quadrangular shape. An advantage of such a design is a significant increase of heat transfer from the whole surface of the heat conductive plates averted from the LED's. The shape of the thermally conductive plates can be suitably designed and tuned to the shape of the casing of the lamp, or the cooling plates can form the rear part of the lamp casing, or they can be part of the wall of a cooling channel that may have a closed or open profile. Thus, the cooling fins may be exposed to the cooling effect of streaming air.

The anode and cathode contact elements of the LED's directly bear on the cooling plates. No PCB electric insulation is used where the dielectric is a poor thermal conductor, but the thermal pads of the LED's may directly bear on the cooling plates. Therefore, the cooling plates fitted with cooling elements remove more heat from the LED's, which significantly extends their service life and improves the lighting output.

Thus, the advantages of the light source in accordance with the invention consist in an increase of heat removal from the LED's, which results in an extension of the service life of the LED's and increase of the luminous intensity of the LED's. More advantages consist in a combination of the cooling function of the thermally conductive plates and the supporting function for attachment of the LED's and the possibility to use the heat conductive plates as part of the wall of the lamp casing or a cooling channel. Another advantage is the structural simplicity and design variability.

OVERVIEW OF FIGURES IN THE DRAWINGS

The light source in accordance with the invention is clarified with the use of drawings where:

EMBODIMENT EXAMPLE

Figure 1:
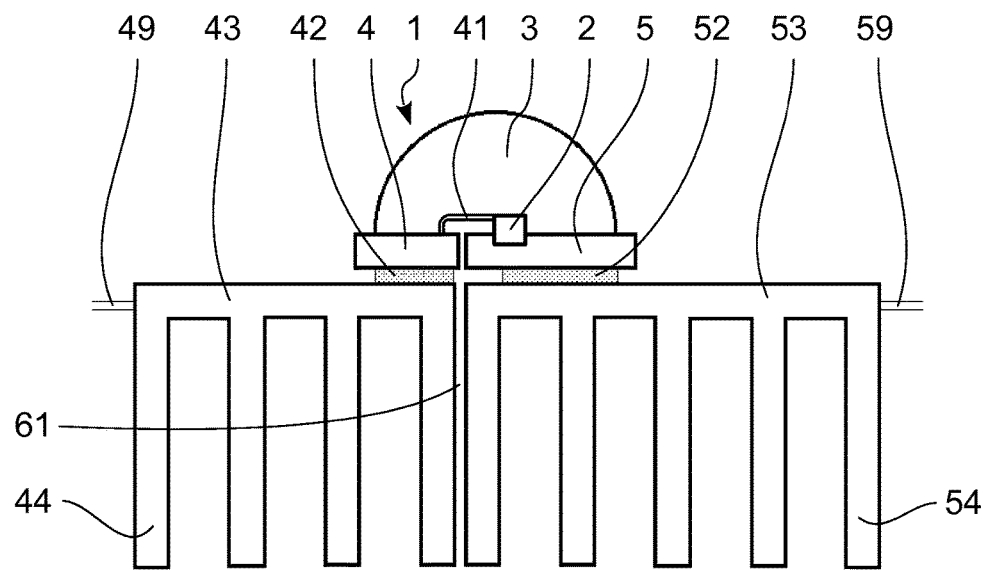
FIG. 1 shows a cross-section of a light source with the cooling plates.

Referring to FIG. 1, the light source consists of a light emitting diode (LED) 1 that comprises a monocrystal 2 covered by a cap 3 of a transparent material at one side, and fitted with an anode contact element 4 to supply and a cathode contact element 5 to lead away direct current at the other side. The anode outlet of the monocrystal 2 is connected, with the use of an electrically conductive wire 41, to the anode contact element 4, which is connected to the cooling plate 43 with thermally and electrically conductive adhesive 42. The monocrystal 2 is housed in the body of the cathode contact element 5 and its cathode outlet is directly connected to the contact element 5. The cathode contact element 5 is connected to the cooling plate 53 with the use of thermally and electrically conductive adhesive 52. The cooling plates 43, 53 are separated from each other by an insulating air gap 61, are arranged next to each other and create a planar formation as an example.

The cooling plates 43, 53 are fitted with electric leads 49, 59 for the supply and outlet of electric current. The cooling plates 43, 53 are connected to the inlet and outlet of electricity without an inserted printed circuit board. A conductive printed circuit board the outlets of which are connected to the feet of the electrically conductive cooling arms of the LED's for the supply and outlet of electricity according to the prior art does not remove heat from the LED's and creates a spatial obstacle. The design of the light source in accordance with the present invention is based on the finding that no replacement is necessary and the current can be directly connected to the conductive cooling plates 43, 45. Therefore, according to the invention, electric current is directly supplied by the electric leads 49, 59 to the segmented cooler consisting of the anode and cathode contact elements 4, 5. Thus, the individual contact elements 4, 5, or the cooling plates 43, 53; 45, 55, respectively, act as a cooler and as the conductive path replacing the printed circuit at the same time.

According to the invention, the LED's 1 are arranged in a row, and with their anode contact elements 4 they are connected to one cooling plate 43 and with their cathode contact elements 5 they are connected to the other cooling plate 53, wherein the mutually electrically insulated cooling plates 43, 53 are arranged with their lateral sides next to each other and on the surfaces averted from the LED's 1 they are fitted with cooling elements for transfer of heat to the cooling media. On the side of the thermally conductive plates 43, 53 averted from the LED's 1, cooling elements are arranged that consist of sets of cooling fins 44, 54 protruding perpendicularly from the sides of the cooling plates 43, 53 averted from the LED's 1.

The cooling plates 43, 45 create a flat formation of a planar shape that is used to fix the row of the LED's 1 and at the same time removes heat from the LED's 1. The cooling plates 43, 53 can be conveniently arranged on the vertical plane. In another embodiment the cooling plates 43, 53 may be part of a single cooling block and the cooling fins 44, 54 may reach into the cooling channel supplying cooling media.

Figure 2:
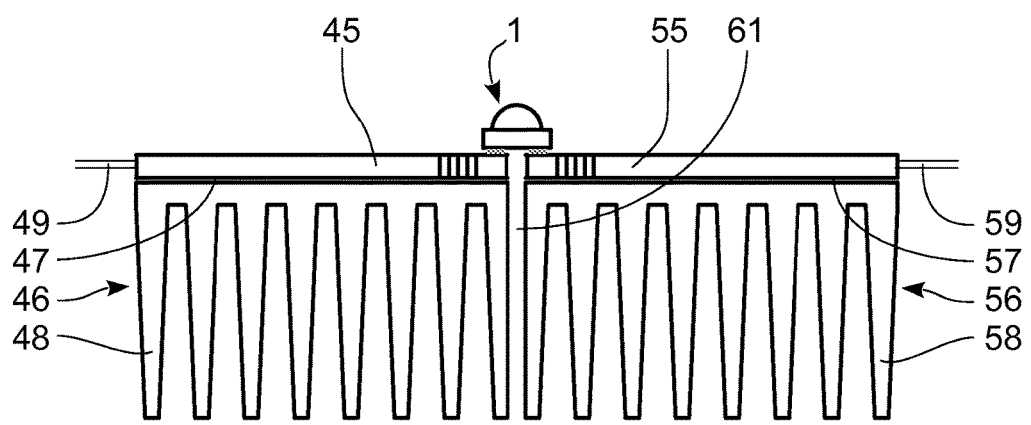
FIG. 2 shows a cross-section of an alternative design of the light source.

Referring to FIG. 2, the LED 1 is connected to cooling plates 45, 55 that are, on the side averted from the LED 1, fitted with contact surfaces 47, 57 for surface contact with cooling elements consisting of sets of cooling bodies 46, 56 arranged on the sides of the cooling plates 45, 55 averted from the LED's 1. The cooling fins 48, 58 of cooling bodies 46, 56 can be arranged in an inclined manner, conveniently perpendicularly to the cooling plates 45, 55. Between the cooling plates 45, 55 and the cooling elements insulating air gaps 61 are provided for mutual electric insulation.

Figure 3:
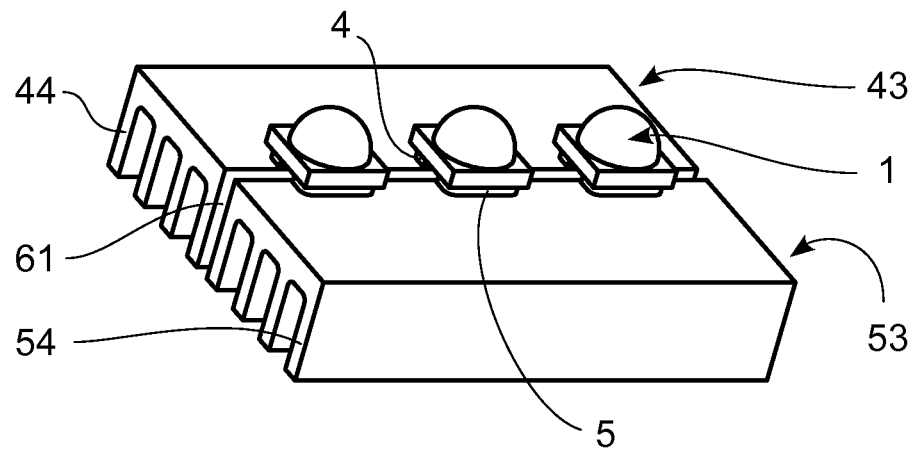
FIG. 3 is a perspective view of the light source.

FIG. 3 illustrates the arrangement of the LED's 1 next to each other and the connection of their anode contact elements 4 to the electrically and thermally conductive cooling plate 43 as well as the connection of the cathode contact elements 5 to the electrically and thermally conductive cooling plate 53. The cooling plates 43, 53 are fitted with cooling fins 44, 54 and they are electrically insulated from each other with an electrically insulating air gap 61.

Figure 4:
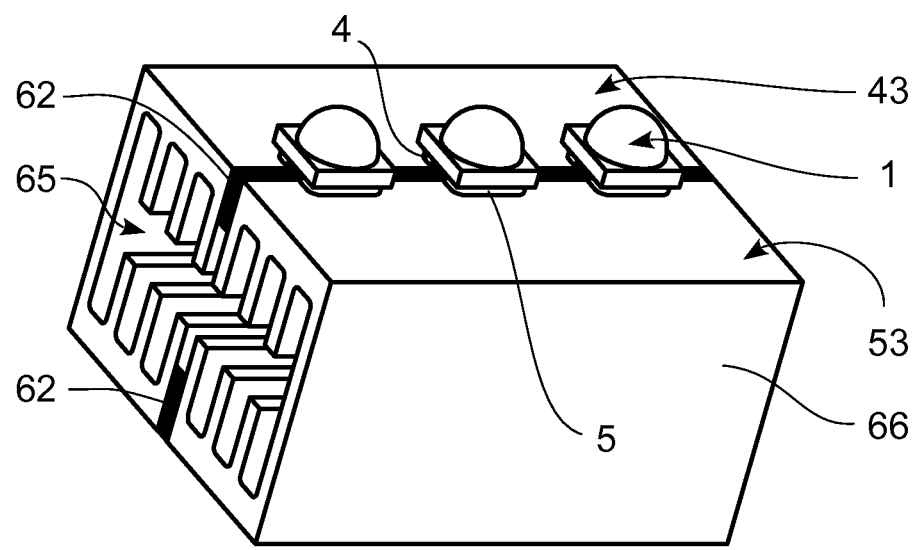
FIG. 4 is a cross-section of the light source with the cooling plates having the shape of a channel.

Referring to FIG. 4, the cooling plates 43, 53 are part of the wall of a cooling channel 65, which thus consists of two parts that are electrically insulated from each other. In this particular case the electrically insulating gaps are filled with electrically insulating inserts 62.

LIST OF REFERENCE SIGNS

1 LED
2 monocrystal
3 cap
4 anode contact element
41 electrically conductive wire
42 thermally and electrically conductive adhesive
43 cooling plate
44 cooling fins
45 cooling plate
46 cooling body
47 contact surface
48 cooling fins
49 electric lead
5 cathode contact element
52 thermally and electrically conductive adhesive
53 cooling plate
54 cooling fins
55 cooling plate
56 cooling body
57 contact surface
58 cooling fins
59 electric lead
61 electrically insulating gap
62 electrically insulating insert
65 cooling channel

The invention claimed is:

1. A light source, especially for lamps of motor vehicles, comprising:
   a plurality of light emitting diodes (LED) (1) arranged in a row, wherein each light emitting diode (1) comprises a monocrystal (2), covered by a cap (3) of a transparent material at one side, and an anode contact element (4) to supply and a cathode contact element (5) to lead away direct current at the other side, wherein the anode contact element (4) and the cathode contact element (5) each comprises a heat-conducting body formed as a plate,
   wherein the light emitting diodes (1) arranged in a row are connected with their anode contact elements (4) to one thermally and electrically conductive cooling plate (43, 45) and with their cathode contact elements (5) to another thermally and electrically conductive cooling plate (53, 55), wherein the anode and cathode contact elements (4, 5) are positioned between the cap (3) of their respective light emitting diodes (1) and the conductive cooling plates (43, 53; 45, 55) such that the anode and cathode contact elements (4, 5) are configured to convey heat generated by the light emitting diodes (1) to the conductive cooling plates (43, 53; 45, 55),
   wherein the cooling plates (43, 53; 45, 55) are electrically insulated from each other and are arranged with their lateral sides next to each other, and each of the cooling plates (43, 53; 45, 55) is fitted on a horizontal surface averted from the light emitting diodes (1) with a plurality of cooling elements extending vertically from the horizontal surface of the cooling plate (43, 53; 45, 55) and configured to transfer heat to a cooling media,
   wherein the cooling plates (43, 45; 53, 55), together with the cooling elements, delimit a cooling channel (65) with a closed cross-section, and wherein the cooling plates (43, 45; 53, 55) form a wall or walls of the cooling channel (65).

2. The light source according to claim 1, wherein the surface of the cooling plates (43, 45; 53, 55) is planar, round or broken.

3. The light source according to claim 1, wherein the cooling elements comprise systems of cooling fins (44, 54; 46, 56) arranged on the sides of the cooling plates (43, 53; 45, 55) averted from the light emitting diodes (1).

4. The light source according to claim 1, wherein the monocrystal (2) of each light emitting diode (1) is housed in the body of one of the respective contact elements (4, 5).

\* \* \* \* \*